United States Patent
Miura

[19]

[11] Patent Number: 6,158,649
[45] Date of Patent: Dec. 12, 2000

[54] SOLDER BALL MOUNTING APPARATUS AND METHOD

[75] Inventor: Takeo Miura, Kumamoto, Japan

[73] Assignee: NEC Corporation, Japan

[21] Appl. No.: 09/337,247

[22] Filed: Jun. 22, 1999

[30] Foreign Application Priority Data

Jun. 23, 1998 [JP] Japan ................... 10-175728

[51] Int. Cl.[7] .............. B23K 1/20; B23K 31/02
[52] U.S. Cl. ............... 228/246; 228/6.2; 228/9; 228/41; 228/45
[58] Field of Search .................. 228/246, 103, 228/178, 6.1, 6.2, 9, 14, 32, 45, 41; 73/1.79; 438/51, 55, 64, 106, 26; 324/109, 76.11

[56] References Cited

U.S. PATENT DOCUMENTS

| | | | |
|---|---|---|---|
| 5,386,623 | 2/1995 | Okamoto et al. | 29/832 |
| 5,415,679 | 5/1995 | Wallace | 75/331 |
| 5,601,229 | 2/1997 | Nakazato et al. | 288/246 |
| 5,626,277 | 5/1997 | Kawada | 228/41 |
| 5,902,495 | 5/1999 | Burke et al. | 219/85.22 |
| 5,976,965 | 2/1999 | Takahashi et al. | 438/616 |
| 5,983,490 | 11/1999 | Sakemi | 29/833 |

FOREIGN PATENT DOCUMENTS

| | | | |
|---|---|---|---|
| 2278831 | 11/1990 | Japan | H01L 21/321 |
| 4-75357 | 3/1991 | Japan | H01L 21/60 |
| 6-310515 | 11/1994 | Japan | H01L 21/321 |
| 7283521 | 10/1995 | Japan | H05K 3/34 |
| 8-115942 | 5/1996 | Japan | H01L 21/60 |
| 2551370 | 8/1996 | Japan | H01L 21/60 |
| 98172 | 1/1997 | Japan | H01L 23/12 |
| 9-64102 | 3/1997 | Japan | H01L 21/60 |

*Primary Examiner*—Patrick Ryan
*Assistant Examiner*—Colleen Cooke
*Attorney, Agent, or Firm*—Hayes, Soloway, Hennessey, Grossman & Hage, P.C.

[57] ABSTRACT

By providing a mechanism for removing static electricity, even slight electric charge caused by natural electrification is removed before holding solder balls. A necessary number of solder balls are held securely. The solder balls attracted by vacuum suction are brought close to pads until the solder balls come in contact with flux surfaces of pads. While continuously holding the solder balls using vacuum suction, the solder balls are pressed against the pads. The solder balls are embedded in the flux having adherence power and held. In a solder ball mounting apparatus, therefore, solder balls can be mounted on pads of a substrate securely without using electrostatic force which is difficult to control.

9 Claims, 3 Drawing Sheets

SOLDER BALL MOUNTING APPARATUS AND METHOD

BACKGROUND OF THE INVENTION

1. Field of the Invention

The present invention relates to a solder ball mounting apparatus, and method, for mounting solder balls on pads of a substrate.

2. Description of the Related Art

In a ball grid array which is one of a surface mounting type semiconductor device, solder bumps are formed on pads located on a substrate. As for a method for forming the solder bumps, ball-shaped solder lumps were made separately. Flux was applied to pads of the substrate, and the solder balls were placed thereon. The solder balls were fused again. In this way, the solder bumps were formed. For mounting a large number of solder balls on pads arranged on the substrate at narrow pitches, there are various problems such as positioning of the solder balls on the pads and a method for holding solder balls. For solving the problems, a large number of improvements have been proposed.

For example, one of the methods is disclosed in Japanese Patent Application Laid-Open NO. Hei-07-283521. According to this method, a holding mechanism having a plurality of partitions is electrified. Solder balls are lifted by electrostatic force. The solder balls are placed in the partitions and held therein. The holding mechanism is moved so as to be located over the substrate. Thereafter, supply of static electricity is stopped. The solder balls are separated from partitions by ion plow. As a result, solder balls are mounted on the pads.

In the above described mounting method, however, there is a fear that the holding mechanism is charged with more static electricity than needed and excessive solder balls stick to the holding mechanism. For example, a solder ball is attracted by a partition portion, and the solder ball sticks to the holding mechanism in such a state that the solder ball is in contact with an adjacent solder ball. Even if static electricity is removed by subsequent ion plow, and ion flow is conducted at the time of mounting on the substrate, it is difficult to remove static electricity uniformly from the entire surface of the holding mechanism. Nonuniformity of the static electricity removing state and delay of falling of solder balls resulting therefrom are caused. This results in a problem of displacement of solder ball mounting positions. In any case, it is difficult to control solder ball holding and mounting by using a mechanism for generating static electricity.

Furthermore, a method for forming solder bumps is disclosed in Japanese Patent Application Laid-Open NO. Hei-02-278831. According to this method, a hole is formed in a predetermined position of a plate which is not wettable by fused solder. A solder member is held by this hole. The plate is put upon an insulative substrate so that the solder member may be opposed to a conductor for solder bump disposed on the insulative substrate. The solder member is heated, and the solder member is fused with the conductor.

Furthermore, a semiconductor chip mounting method is disclosed in Japanese Patent Application No. 2551370. According to this method, conductive paste is stuck to pads formed on a substrate by screen printing. Thereafter, metallic balls are mounted on the conductive paste.

Furthermore, a method for fabricating soldered electronic parts is proposed in Japanese Patent Application Laid-Open NO. Hei-09-8172. According to this method, a solder ball is picked up by using vacuum suction, and flux is applied to the solder ball. Thereafter, a suction head is moved so as be located over a substrate, and the solder ball is mounted on an electrode of the substrate.

However, these methods disclosed in Japanese Patent Application Laid-Opens and Japanese Patent Application have the same drawbacks as those of the above described conventional technique.

SUMMARY OF THE INVENTION

An object of the present invention is to provide a solder ball mounting apparatus, and method, capable of mounting solder balls on pads of a substrate securely without using electrostatic force which is difficult to control.

In accordance with a first aspect of the present invention, a solder ball mounting apparatus includes a solder ball vessel loaded with a plurality of solder balls, a first ionized air blower for blowing gas containing ions to the solder balls in the solder ball vessel, a suction tool having a plurality of holes formed therein in order to apply vacuum suction to the solder balls cleared of static electricity by the first ionized air blower, a second ionized air blower for blowing gas containing ions to a surface of the suction tool having the holes formed therethrough, before attracting the solder balls by using vacuum suction, and a mounting head for letting the suction tool attached thereto enter the solder ball vessel, attracting the solder balls by vacuum suction, then moving while holding the solder balls, positioning the suction tool over a substrate onto which the solder balls should be transferred, lowering the suction tool, and transfer the solder balls onto respective pads provided on the substrate.

Furthermore, it is desirable that the solder ball mounting apparatus includes an electric charge measuring unit for measuring electric charge held by the solder balls and the surface of the holes of the suction tool. Furthermore, it is desirable that the solder ball mounting apparatus includes a distance measuring unit, such as a laser interferometer, for measuring a distance between the suction tool positioned over the substrate while holding the solder balls by suction and a surface of the substrate. For accurately mounting the solder balls, the solder ball mounting apparatus includes an electrostriction device for lowering the suction tool attracting and holding the solder balls, stopping the solder balls near the pads, causing application of a voltage, and pressing the solder balls against the substrate. As occasion demands, the solder ball mounting apparatus includes a third ionized air blower for blowing gas containing ions via a mesh provided at the bottom of the solder ball vessel.

In accordance with another aspect of the present invention, there is provided a solder ball mounting method using a solder ball mounting apparatus including a solder ball vessel loaded with a plurality of solder balls, a first ionized air blower for blowing gas containing ions to the solder balls in the solder ball vessel, a suction tool having a plurality of holes formed therein in order to effect vacuum suction on the solder balls cleared of static electricity by the first ionized air blower, a second ionized air blower for blowing gas containing ions to a surface of the suction tool having the holes formed therethrough, before attracting the solder balls by vacuum suction, and a mounting head for letting the suction tool attached thereto enter the solder ball vessel, attracting the solder balls by vacuum suction, then moving while holding the solder balls, positioning the suction tool over a substrate onto which the solder balls should be transferred, lowering the suction tool, and transferring solder balls onto respective pads provided on the substrate. Said solder ball mounting method includes the steps of blowing gas containing ions to the solder balls in the solder ball vessel by using the first ionized air blower, blowing gas containing ions to the surface of the suction tool having the holes formed therethrough by using the second ionized air blower, and then letting the suction tool enter the solder ball vessel, supplying dry gas to inside of the solder ball vessel to float the solder balls, and simultaneously therewith attracting the solder balls to the holes by vacuum suction.

Furthermore, it is desirable that the solder ball mounting method includes the step of determining whether the solder ball in the solder ball vessel and/or the surface of the suction tool having the holes formed therethrough have electric charge. In addition, it is desirable that the solder ball mounting method includes the steps of lowering the mounting head until the solder balls attracted by vacuum suction come in contact with flux surfaces of the pads, then lowering the suction tool by a predetermined distance to embed the solder balls in the flux, and discontinuing vacuum suction to transfer the solder balls to the pads.

In the present invention, even slight electric charge caused by natural electrification can be removed before holding solder balls, by providing a mechanism for removing static electricity. A necessary number of solder balls can be held and carried securely without sticking of extraneous solder balls. Furthermore, by bringing the solder balls attracted by vacuum suction close to pads until the solder balls come in contact with flux surfaces of pads, pressing the solder balls against the pads while continuously holding the solder balls using vacuum suction, embedding and holding the solder balls in the flux having adherence power, and then discontinuing vacuum suction of the solder balls, position deviation caused by natural falling is completely prevented and the solder balls can be mounted in accurate positions. This brings about an effect of improved yield in subsequent processes.

DESCRIPTION OF THE PREFERRED EMBODIMENT

A preferred embodiment of the present invention will now be described by referring to accompanying drawing.

Figure 1A:
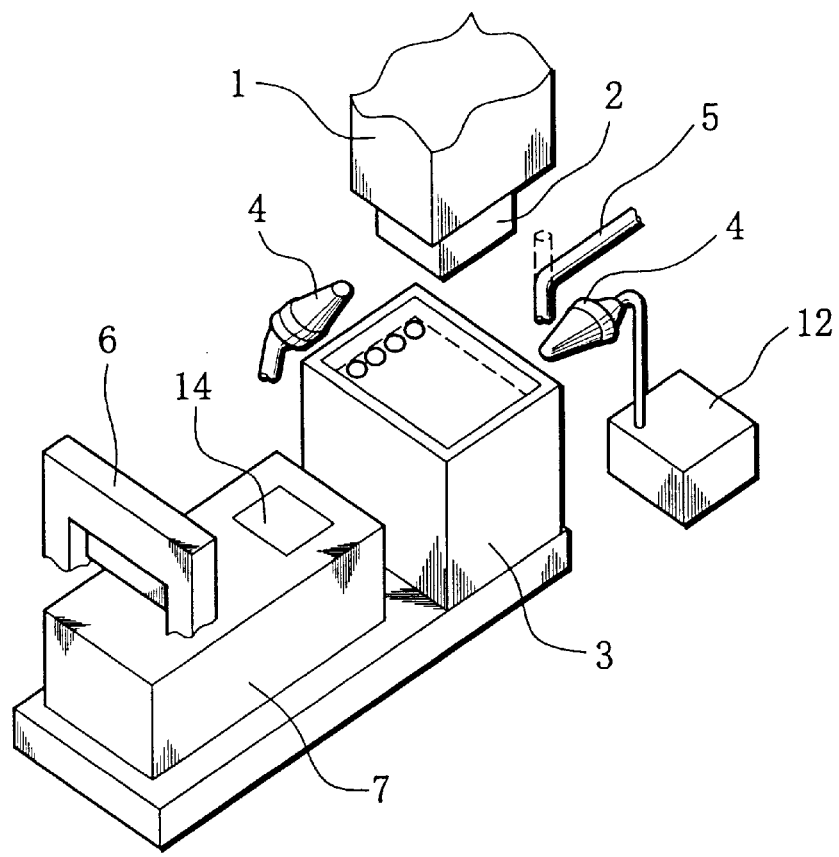
FIGS. 1A and 1B are a perspective view showing a solder ball mounting apparatus according to an embodiment of the present invention, and a horizontal sectional view of a suction tool, respectively.
Figure 1B:
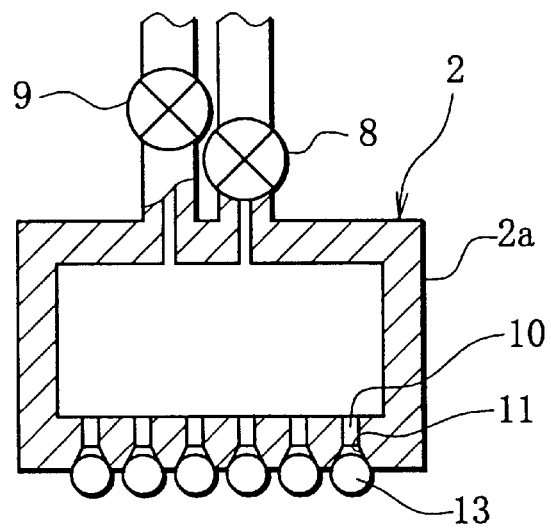

FIGS. 1A and 1B are a perspective view showing a solder ball mounting apparatus according to an embodiment of the present invention, and a horizontal sectional view of a suction tool, respectively. A solder ball mounting apparatus of the present embodiment includes a suction tool 2 having a plurality of suction holes 10 for attracting solder balls 13 by vacuum suction, a mounting head 1 loaded with the suction tool 2, an ionized air blower 4 for conducting blowing gas containing ions on a holding surface of the suction tool 2 and the solder balls 13 located in a solder ball vessel 3, and an ion generator 12.

Furthermore, it is desirable to provide a probe 5 for measuring capacitance which is used to determine whether the solder balls 13 and the surface of the suction tool 2 for holding the solder balls 13 are electrified. This probe 5 is commercially available. By measuring capacitance existing between an electrode of the probe and a subject of the measurement, it is determined whether the subject has been electrified. Thus, the amount of electric charge is measured beforehand. If there is electric charge even if the amount is small, the electric charge is eliminated by using ion flow beforehand. By doing so, the problem caused by sticking of the solder ball 13 to another member which is in turn caused by residual electric charge is avoided.

The suction tool 2 is a box-shaped chamber 2a as shown in FIG. 1B. On a surface of the chamber 2a for holding the solder balls 13, a plurality of suction holes 10 are formed in positions corresponding to pads of a substrate 14. Furthermore, it is desirable to form a chamfering surface 11 at which the suction hole 10 is in contact with the solder ball on an orifice having the same radius as that of the solder ball 13. Further, for the chamber 2a, a valve 8 connected to a vacuum pump, and a valve 9 connected to a dry nitrogen gas tank are provided. It is desirable that the holding surface portion which is the bottom of the chamber 2a is made of conductive resin containing carbon.

Figure 2A:
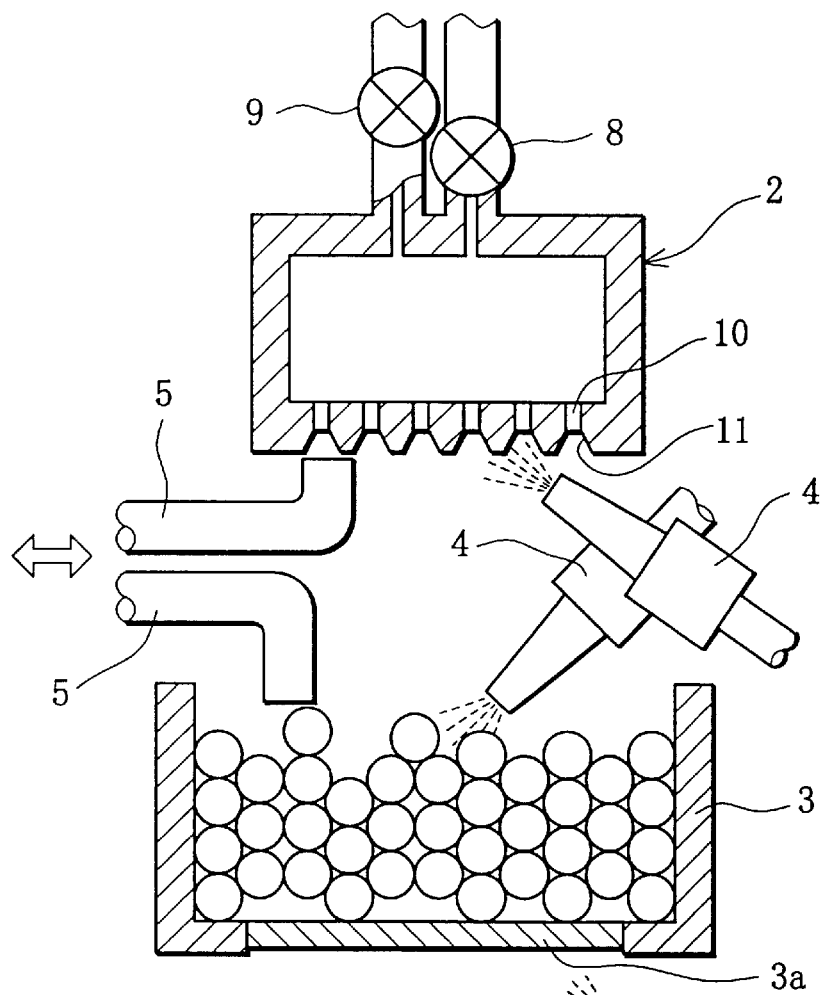
FIGS. 2A and 2B are diagrams showing operation for holding solder balls by using the solder ball mounting apparatus shown in FIGS. 1A and 1B, and FIGS. 2A and 2B are horizontal sectional views of the suction tool illustrating a method for mounting solder balls on a substrate by using the solder ball mounting apparatus shown in FIG. 1A.
Figure 2B:
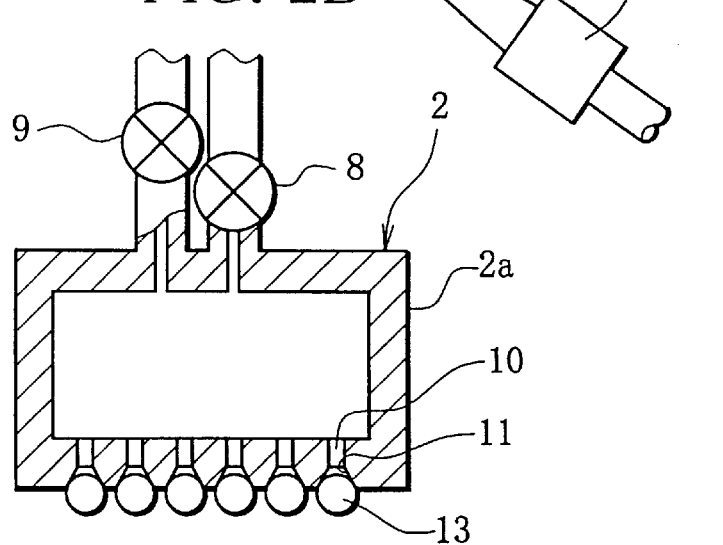

FIGS. 2A and 2B are horizontal sectional views of the suction tool illustrating operation for holding solder balls by using the solder ball mounting apparatus shown in FIGS. 1A and 1B. By referring to these figures, operation of the present embodiment will now be described. First of all, a method for holding the solder balls will now be described. The holding surface of the suction tool and the solder balls 13 in the solder ball vessel 3 are scanned with the probe 5. It is thus determined whether they are electrified. If they are electrified, gas containing ions is blown upon the holding surface of the suction tool 2 and the solder balls 13 by using the ionized air blower 4. After blowing has been conducted for a predetermined time, scanning using the probe 5 is conducted again to determine whether the electric charge has disappeared.

Subsequently, the mounting head 1 is lowered to let the suction tool 2 enter the solder ball vessel 3. From a mesh 3a disposed at the bottom of the solder ball vessel 3, dry nitrogen is blown up through the mesh 3a using an ionized gas blower 4a. At the same time, the valve 8 is opened. As a result, solder balls 13 are blown to the suction holes 10 as shown in FIG. 2B. The solder balls 13 are brought into contact with the chamfering surfaces and held in a stable state. Since the holding surface of the suction tool 2 and the solder balls 13 are completely free of electric charge, a solder ball is prevented from sticking to the solder ball 13 between the solder ball 13 and another solder ball. It is desirable to blow air containing ions instead of dry nitrogen.

Figure 3A:
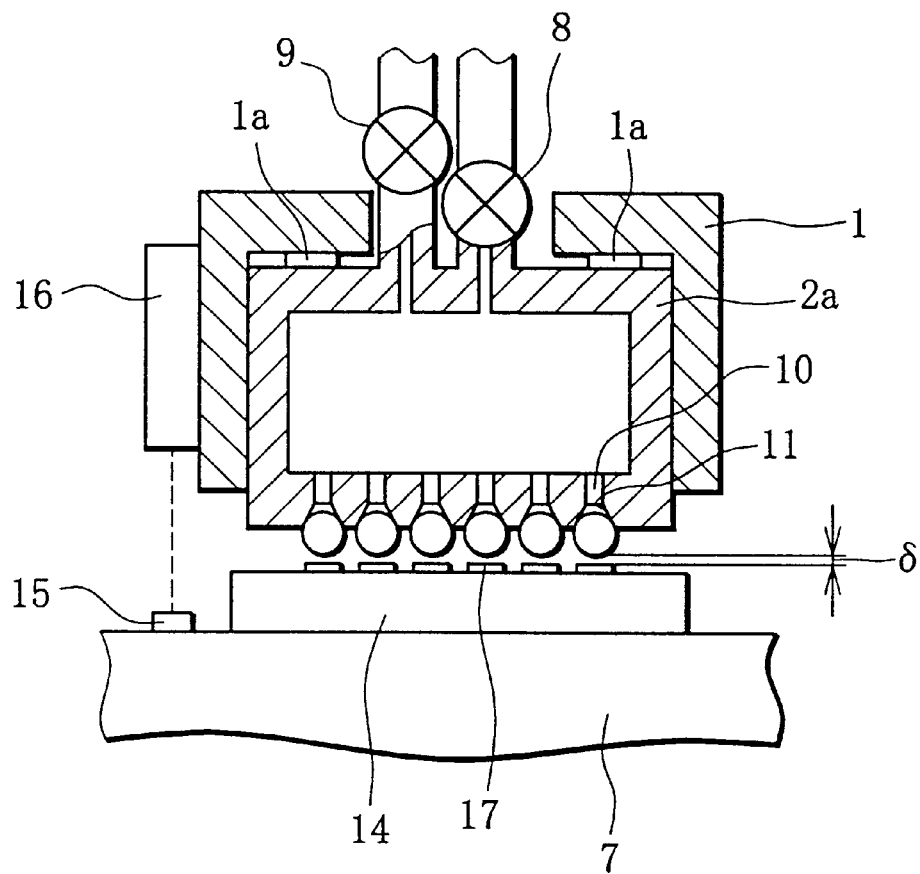
FIGS. 3A and 3B are horizontal sectional views of the suction tool illustrating the operation for mounting solder balls on a substrate by using the solder mounting apparatus of the present embodiment.
Figure 3B:
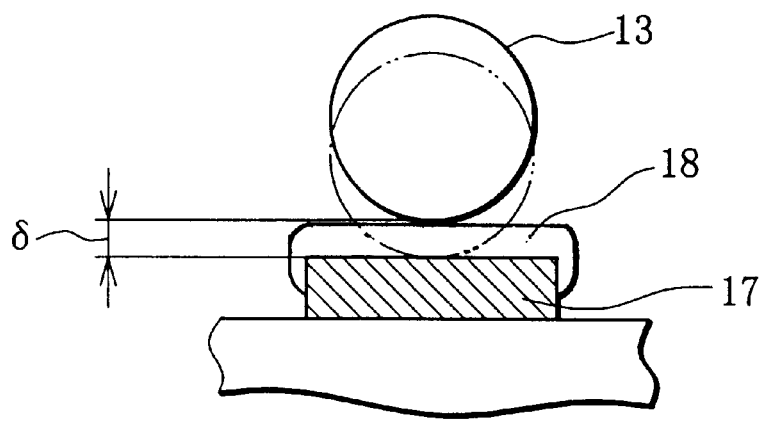

FIGS. 3A and 3B are horizontal sectional views of the suction tool illustrating the operation for mounting solder balls on the substrate by using the solder mounting apparatus shown in FIGS. 1A and 1B. If the degree of vacuum of the chamber 2a becomes stable, then it is determined that a predetermined number of solder balls 13 have been held, and the mounting head 1 is lifted, moved, and positioned over the substrate 14 located on a flux stage 7. The flux stage 7 has flux applied thereto by a squeegee unit 6 (see FIG. 1A).

Subsequently, a laser interferometer 16 attached to the mounting head 1 measures a distance between it and a target 15. This is done in order to lower the mounting head 1 and conduct precise positioning. More particularly, the thickness of the flux applied by the squeegee is subtracted from the distance measured by the interferometer 16 and the resulting value is given to a Z-axis pulse motor as a stopping position. Thereby, the mounting head 1 is lowered and positioned so that the solder balls arrive at the stopping position.

This stopping position is located δ above the top surface of the pad 17. It is desirable to set this δ to the maximum permissible thickness of the applied flux. For example, if the thickness is 200 micrometers, δ is set to 200 micrometers. If a voltage corresponding to 200 micrometers is applied to an electrostriction device 1a, the solder ball 13 represented by a phantom line is embedded in flux 18 as shown in FIG. 2B.

Subsequently, the valve 8 is closed, and the valve 9 is opened. Dry nitrogen is introduced into the chamber 2a. The pressure in the chamber is raised from 1 atm. by approximately 1.1 atm., and then the valve 9 is closed. When the pressure in the chamber 2a becomes stable, the voltage applied to the electrostriction device 1a is removed. As a result, the mounting head 1 rises above δ. The solder balls 13 are thus separated from the holding surface of the suction tool 2. The solder balls are held by adhesive power of the flux 18, and positioned in accurate positions.

What is claimed is:

1. A solder ball mounting apparatus comprising:

a solder ball vessel loaded with a plurality of preformed solder balls;

a first ionized air blower for blowing gas containing ions to the solder balls in the solder ball vessel;

a suction tool having a plurality of holes formed therein in order to apply vacuum suction to the solder balls cleared of electricity by the first ionized air blower;

a second ionized air blower for blowing gas containing ions to a surface of the suction tool having the holes formed therethrough, before attracting the solder balls by using vacuum suction;

a mounting head for letting the suction tool attached thereto enter the solder ball vessel, attracting the solder balls by vacuum suction, then moving while holding the solder balls, positioning the suction tool over the substrate having pads onto which the solder balls are to be transferred an electrostriction device for lowering the suction tool attracting and holding the solder balls, stopping the solder balls near the pads, and causing application of a voltage for transferring and pressing the solder balls onto the respective pads on the substrate.

2. A solder ball mounting apparatus according to claim 1, further comprising an electric charge measuring unit for measuring electric charge held by the solder balls and the surface of the holes of the suction tool.

3. A solder ball mounting apparatus according to claim 1, further comprising a flux applicator for applying a controlled thickness of flux to said pads, and distance measuring unit for measuring a distance between the suction tool positioned over the substrate while holding the solder balls by suction and a surface of the substrate.

4. A solder ball mounting apparatus according to claim 3, wherein said distance measuring unit comprises a laser interferometer.

5. A solder ball mounting apparatus according to claim 1, further comprising a third ionized gas blower for blowing gas containing ions via a mesh provided at the bottom of the solder ball vessel.

6. A solder ball mounting method using a solder ball mounting apparatus including a solder ball vessel loaded with a plurality of preformed solder balls, a first ionized air blower for blowing gas containing ions to the solder balls in the solder ball vessel, a suction tool having a plurality of holes formed therein in order to effect vacuum suction on the solder balls cleared of electricity by the first ionized air blower, a second ionized air blower for blowing gas containing ions to a surface of the suction tool having the holes formed therethrough, before attracting the solder balls by vacuum suction, and a mounting head for letting the suction tool attached thereto enter the solder ball vessel, attracting the solder balls by vacuum suction, then moving while holding mounting head for letting the suction tool attached thereto enter the solder ball vessel, attracting the solder balls by vacuum suction, then moving while holding the solder balls, positioning the suction tool over a substrate having pads onto which the solder balls are to be transferred, lowering the suction tool, and transferring the solder balls onto the respective pads provided on the substrate, said solder ball mounting method comprising the steps of:

blowing gas containing ions to the solder balls in the solder ball vessel by using the first ionized air blower;

blowing gas containing ions to the surface of the suction tool having the holes formed therethrough by using the second ionized air blower;

then letting the suction tool enter the solder ball vessel, supplying dry gas to inside of the solder ball vessel to float the solder balls, and simultaneously therewith attracting the solder balls to the holes by vacuum suction; and applying a voltage to the suction tool to transfer and press the solder balls onto the respective pads on the substrate.

7. A solder ball mounting method according to claim 6, further comprising the step of:

determining whether the solder ball in the solder ball vessel and/or the surface of the suction tool having the holes formed therethrough have electric charge.

8. A solder ball mounting method according to claim, 6, further comprising the steps of:

applying a controlled thickness of flux to said pads;

lowering the mounting head until the solder balls attracted by vacuum suction come in contact with flux surfaces of the pads;

then lowering the suction tool by a predetermined distance to embed the solder balls in the flux; and discontinuing the vacuum suction to transfer the solder balls to the pads.

9. A solder ball mounting method according to claim 7, further comprising the steps of:

applying a controlled thickness of flux to said pads;

lowering the mounting head until the solder balls attracted by vacuum suction come in contact with flux surfaces of the pads;

then lowering the suction tool by a predetermined distance to embed the solder balls in the flux; and discontinuing the vacuum suction to transfer the solder balls to the pads.

* * * * *